(12) United States Patent
Locke (10) Patent No.: US 7,402,992 B2
(45) Date of Patent: Jul. 22, 2008

(54) CIRCUIT COMPONENT TESTER

(75) Inventor: Christopher Locke, Sandy Hook, CT (US)

(73) Assignee: AT&T Knowledge Ventures, L.P., Reno, NV (US)

(*) Notice: Subject to any disclaimer, the term of this patent is extended or adjusted under 35 U.S.C. 154(b) by 0 days.

(21) Appl. No.: 11/441,255

(22) Filed: May 26, 2006

(65) Prior Publication Data

US 2007/0285084 A1   Dec. 13, 2007

(51) Int. Cl.
*G01R 19/14* (2006.01)
*G01R 19/00* (2006.01)

(52) U.S. Cl. .................... 324/133; 324/76.11; 324/73.1
(58) Field of Classification Search ................ 324/73.1, 324/76.11, 133
See application file for complete search history.

(56) References Cited

U.S. PATENT DOCUMENTS 4,554,507 A * 11/1985 Brown ........................ 324/767
2003/0090271 A1* 5/2003 Hurwicz ..................... 324/424

* cited by examiner

*Primary Examiner*—Vincent Q Nguyen
(74) *Attorney, Agent, or Firm*—Greenblum & Bernstein, P.L.C.

(57) ABSTRACT

A circuit component tester includes a portable casing and a circuit provided within the casing. A plurality of leads are provided to electrically connect the circuit to a gate and two terminals of a circuit component under test. A test switch provided on the casing initiates application of test voltage to at least one of the two terminals of the circuit component under test. A gate switch provided on the casing initiates application of gate voltage to the gate of the circuit component under test. At least one of the test switch and the gate switch are operable to verify functionality of the circuit component under test.

21 Claims, 6 Drawing Sheets

CIRCUIT COMPONENT TESTER

BACKGROUND

1. Field of the Disclosure

The present disclosure relates to testing circuit components. More particularly, the present disclosure relates to a device for conveniently testing circuit components such as silicon controlled rectifiers (SCRs) and Triacs.

2. Background Information

A thyristor or silicon controlled rectifier (SCR) is a solid-state semiconductor device that can be used to function as a switch. The construction of an SCR includes four layers of semiconductor material arranged in alternating N-type and P-type layers. The Anode is provided at the outer P layer, the Gate is provided at the inner P layer, and the Cathode is provided at the outer N layer. SCRs are typically designed to be turned on only when a voltage pulse is applied to the Gate.

A Triac is essentially two SCRs joined back to back in parallel. A Triac can also be used to function as a switch. As individual SCRs are generally more flexible, they are more commonly used in complex, high-power circuits, whereas Triacs are more commonly used in simple, low-power circuits.

There are numerous models of SCRs and Triacs available on the market, and they are used for a wide variety of purposes. For example, SCRs may be used for direct current (DC) power plants. However, for a variety of reasons, testing of SCR and Triac functionality is typically performed, if at all, by building a circuit by hand to apply an appropriate voltage to the Gate and ensure the SCR or Triac is performing at design specifications. This process is time consuming and difficult for an inexperienced technician. However, some models of SCRs and Triacs are relatively expensive, such that great cost may be incurred if such SCRs and Triacs are not tested before being installed in the field. An entity that uses numerous SCRs and Triacs suffers great expense even in testing such components individually using hand-built testing circuits. However, even greater cost is incurred if untested SCRs and Triacs are used in field equipment where they ultimately fail to perform as expected.

Ohm-meters have been used to test SCRs and Triacs for functionality. However, simple ohm-meters are not capable of testing the full functionality of SCRs and Triacs. Further, as explained above, it is inefficient to continually build and modify circuits to test functionality of SCRs and Triacs.

DETAILED DESCRIPTION

In view of the foregoing, the present disclosure, through one or more of its various aspects, embodiments and/or specific features or sub-components, is thus intended to bring out one or more of the advantages as specifically noted below.

According to an aspect of the present disclosure, a circuit component tester includes a portable casing and a circuit provided within the casing. The circuit component tester further includes leads for electrically connecting the circuit to a gate and two terminals of a circuit component under test. At least one switch provided on the casing initiates application of test voltage to at least one of the two terminals of the circuit component under test and initiates application of gate voltage to the gate of the circuit component under test. The at least one switch is operable to verify functionality of the circuit component under test.

According to another aspect of the present disclosure, the leads include a first test lead arranged in a path between a positive side of a test battery and a second test lead.

According to still another aspect of the present disclosure, the circuit further includes a voltage divider network arranged between the second test lead and a negative side of the test battery, and a first light emitting diode and a second light emitting diode aligned oppositely and arranged in parallel to the first light emitting diode.

According to yet another aspect of the present disclosure, the voltage divider network further includes a first resistor and a second resistor arranged in parallel with the first resistor, and a third resistor arranged between the negative side of the test battery and the parallel first resistor and second resistor.

According to another aspect of the present disclosure, the at least one switch further includes a test switch to initiate the application of test voltage to at least one of the two terminals of the circuit component under test, and a gate switch to initiate the application of gate voltage to the gate of the circuit component under test.

According to still another aspect of the present disclosure, the first light emitting diode and the second light emitting diode are arranged in parallel to the first resistor and the second resistor.

According to yet another aspect of the present disclosure, the circuit further includes a fourth resistor arranged between a positive terminal of a gate battery and a gate lead.

According to another aspect of the present disclosure, the circuit further includes a third light emitting diode and a fourth light emitting diode aligned oppositely and arranged in parallel to the third light emitting diode.

According to still another aspect of the present disclosure, the parallel third light emitting diode and fourth light emitting diode are arranged between the fourth resistor and the gate lead.

According to yet another aspect of the present disclosure, voltage values of the batteries and resistance values of the first resistor, second resistor, third resistor and fourth resistor are selected to generate a test current within a specification of the circuit component under test.

According to another aspect of the present disclosure, values of the first resistor and the second resistor are substantially equal.

According to still another aspect of the present disclosure, one of the first and second light emitting diodes is activated when the test switch is moved to a forward position.

According to yet another aspect of the present disclosure, the other of the first and second light emitting diodes is activated when the test switch is moved to a reverse position.

According to another aspect of the present disclosure, one of the third and fourth light emitting diodes is activated when the gate switch is moved to a positive position.

According to still another aspect of the present disclosure, the other of the third and fourth light emitting diodes is activated when the gate switch is moved to a negative position.

According to yet another aspect of the present disclosure, the circuit component under test is determined to function properly when the one of the first and second light emitting diodes remains activated after the gate switch is moved to an off position and the one of the third and fourth light emitting diodes is resultantly inactivated.

According to an aspect of the present disclosure, a method of testing circuit components includes connecting leads for electrically connecting a circuit of a circuit component tester to a gate and two terminals of a circuit component under test. A test switch provided on the portable casing is activated to initiate application of a test voltage to at least one of two terminals of a circuit component under test. A gate switch provided on the portable casing is activated to initiate application of a gate voltage to a gate of the circuit component under test. At least one of the test switch and the gate switch are operable to verify functionality of the circuit component under test.

According to another aspect of the present disclosure, the method further includes verifying that one of multiple light emitting diodes on the circuit component tester illuminates in response to at least one of activating the test switch and activating the gate switch.

According to still another aspect of the present disclosure, the method further includes reversing at least one of the test switch and the gate switch, and verifying that at least one of the plurality of light emitting diodes changes illumination status in response.

According to an aspect of the present disclosure, a circuit of a circuit component tester includes leads for electrically connecting the circuit to a gate and two terminals of a circuit component under test. The circuit also includes a test switch that is moved to initiate application of test voltage to at least one of the two terminals of the circuit component under test. The circuit further includes a gate switch that is moved to initiate application of gate voltage to the gate of the circuit component under test. Light emitting diodes illuminate in response to the movement of at least one of the test switch and the gate switch when the circuit component under test operates properly. At least one of the test switch and the gate switch are operable to verify functionality of the circuit component under test.

According to another aspect of the present disclosure, the circuit component under test is one of a silicon controlled rectifier and a triac.

The present disclosure enables convenient testing for circuit components. Circuit components such as SCRs and Triacs can be tested virtually anywhere using a portable circuit component tester as described herein.

Figure 1:
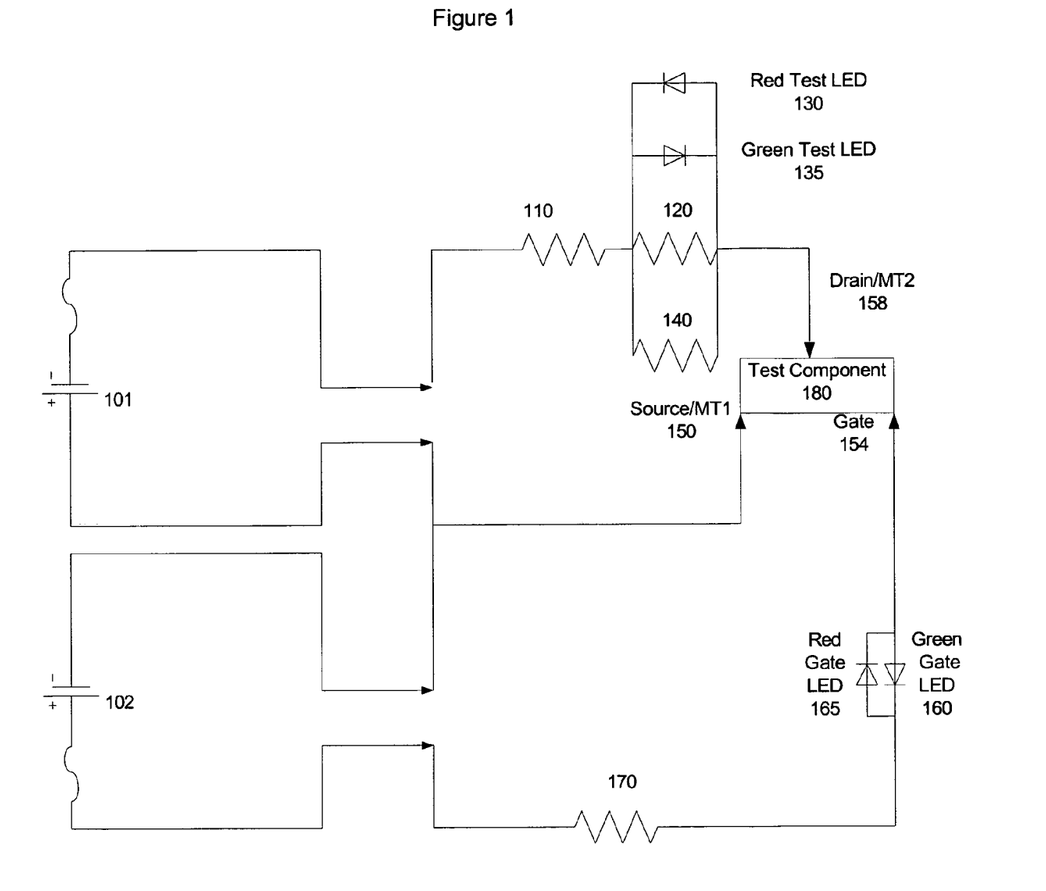
FIG. 1 shows an exemplary circuit for a circuit component tester, according to an aspect of the present disclosure.

FIG. 1 shows an exemplary circuit for a circuit component tester, according to an aspect of the present disclosure. The Test Component 180 represents the SCR or Triac being tested. As shown, a Test battery 101 and a Gate battery 102 provide power to elements of a circuit. The Test battery 101 provides power to a Source/MT1 150 of the Test component 180 under test through a Source/MT1 lead 230a of the circuit component tester (see FIG. 2). The Test battery 101 is also connected to a Drain/MT2 158 of the Test component 180 through a Drain/MT2 lead 230b of the circuit component tester (see FIG. 2). A voltage divider network between the negative (−) terminal of the Test battery 101 and the Drain/MT2 lead 230b includes resistors 120 and 140 in parallel with each other, and resistor 110 in series with the parallel set of resistors 120 and 140. Test LEDs 130 and 135 are also shown oppositely aligned and in parallel with each other and each of the resistors 120 and 140. The exemplary Test LED 130 is red and the exemplary Test LED 135 is green, and each illuminates when properly biased. Different colors are used for the LEDs to allow a user to differentiate between results.

Figure 2:
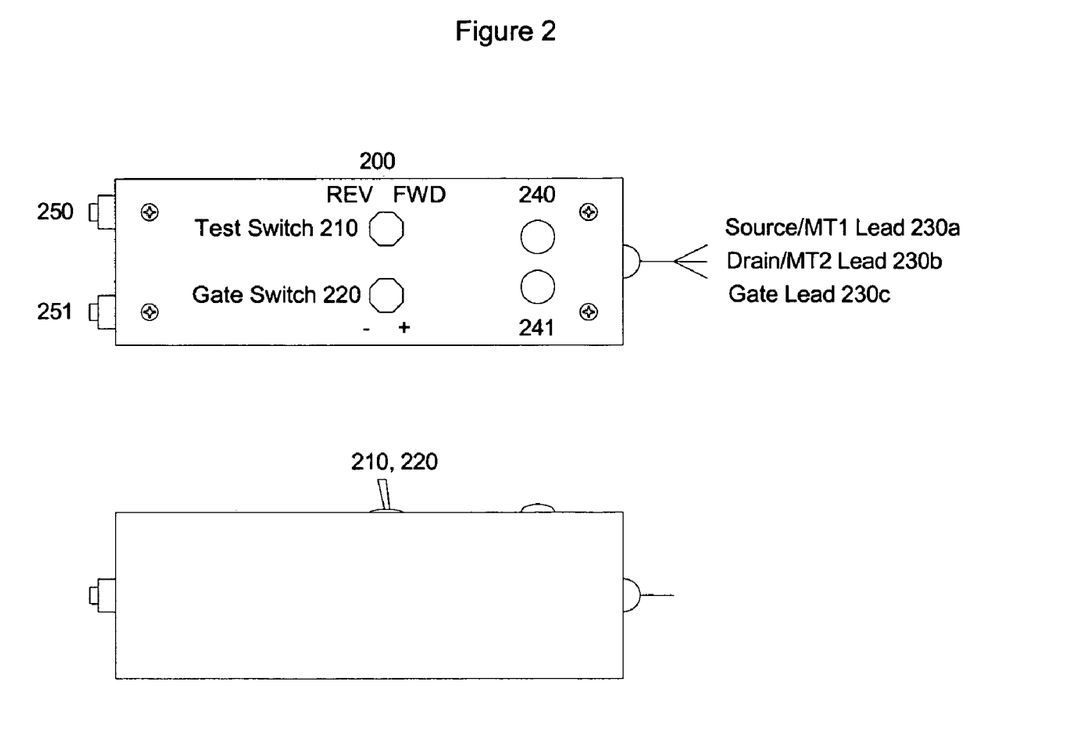
FIG. 2 shows an exterior of a casing for a circuit component tester, according to an aspect of the present disclosure.

The Gate battery 102 provides power to a Gate 154 of a circuit component under test through a Gate lead 230c of the circuit component tester (see FIG. 2). A resistor 170 is provided between the positive (+) terminal of the Gate battery 102 and the Gate lead 230c. Two Gate LEDs 160 and 165 are shown oppositely aligned and in parallel with each other, and in series with the resistor 170. The exemplary Gate LED 165 is red and the exemplary Gate LED 160 is green, and each illuminates when properly biased.

Different colors are used to allow a user to differentiate between the three leads. For example, in one embodiment, the Drain/MT2 lead 230b may be black, the Source/MT1 lead 230a may be red, and the Gate lead 230c may be green. Further, the Gate battery 102 may have an output voltage of 1.25 to 1.5 volts and the Test battery 101 may have an output voltage of 22.5 to 27 volts.

The values of the resistors 110, 120, 140 and 170 are selected to generate test currents within a specification of the Test component 180. For example, the resistor 110 may have a value of 62 ohms, the resistors 120 and 140 may have equal resistance values of 15 ohms, and the resistor 170 may have a resistance value of 22 ohms. Further, variable resistors may be provided so that a user can change the resistance value of each resistor so as to generate test currents within a specification of the Test component 180. In an exemplary embodiment the tester uses three 9-volt (NEDA 1604A) batteries, and 2 AAA (NEDA 24A) batteries.

As parameters consistent with known models of Triacs and SCRs, the minimum current from the Source/MT1 150 to Drain/MT2 158 of the Test component 180 may be 335 mA and the maximum current from the Source/MT1 150 to Drain/MT2 158 of the Test component 180 may be 378 mA. The minimum current from the Gate 154 to Drain/MT2 158 may be 25 mA and the maximum current from the Gate 154 to Drain/MT2 158 may be 36 mA. Of course, the exemplary embodiments of testers described herein are designed to test a particular range of Triacs and SCRs. A tester may need to be modified to possess alternate characteristics to test components with parameters outside of those described above, without departing from the spirit and scope of the present disclosure.

FIG. 2 shows an exterior of a box casing 200 for a circuit component tester, according to an aspect of the present disclosure. Screws attach a lid-type cover to the box casing 200 from the top. As shown, fuse holders 250 and 251 are provided extending through a rear exterior surface of the circuit component tester. The fuse holders 250 and 251 hold fuses that protect the components of the component tester from burning in the event of an internal fault. A fuse is a safety device that protects an electric circuit from excessive current, and consists of a metal element, such as a thin wire, that melts when a current exceeds a specific amperage, thereby opening the circuit. A Test switch 210 and a Gate switch 220 are disposed on an upper exterior surface of the circuit component tester. Source/MT1 lead 230a, Drain/MT2 lead 230b and Gate lead 230c are red, black and green leads with alligator clips, respectively, extending from a front surface of the circuit component tester. Light emitting diode 240 is a Test indicator which indicates whether the Test component 180 conducts a test current. Light emitting diode 241 is a Gate indicator which indicates whether the Test component 180 conducts a gate current. Light emitting diode 240 may include the red test LED 130 and the green test LED 135 shown in FIG. 1. Light emitting diode 241 may include the green gate LED 160 and the red gate LED 165 shown in FIG. 1. The exemplary circuit shown in FIG. 1 is disposed within the exemplary box casing 200 shown in FIG. 2.

Although light emitting diode 240 and light emitting diode 241 are each described above as including separate red and green LEDs, the light emitting diode 240 and light emitting diode 241 may be a single dual-color light emitting diode. A single dual-color light emitting diode emits different colors, such as red and green, depending on the bias applied thereto.

Figure 3:
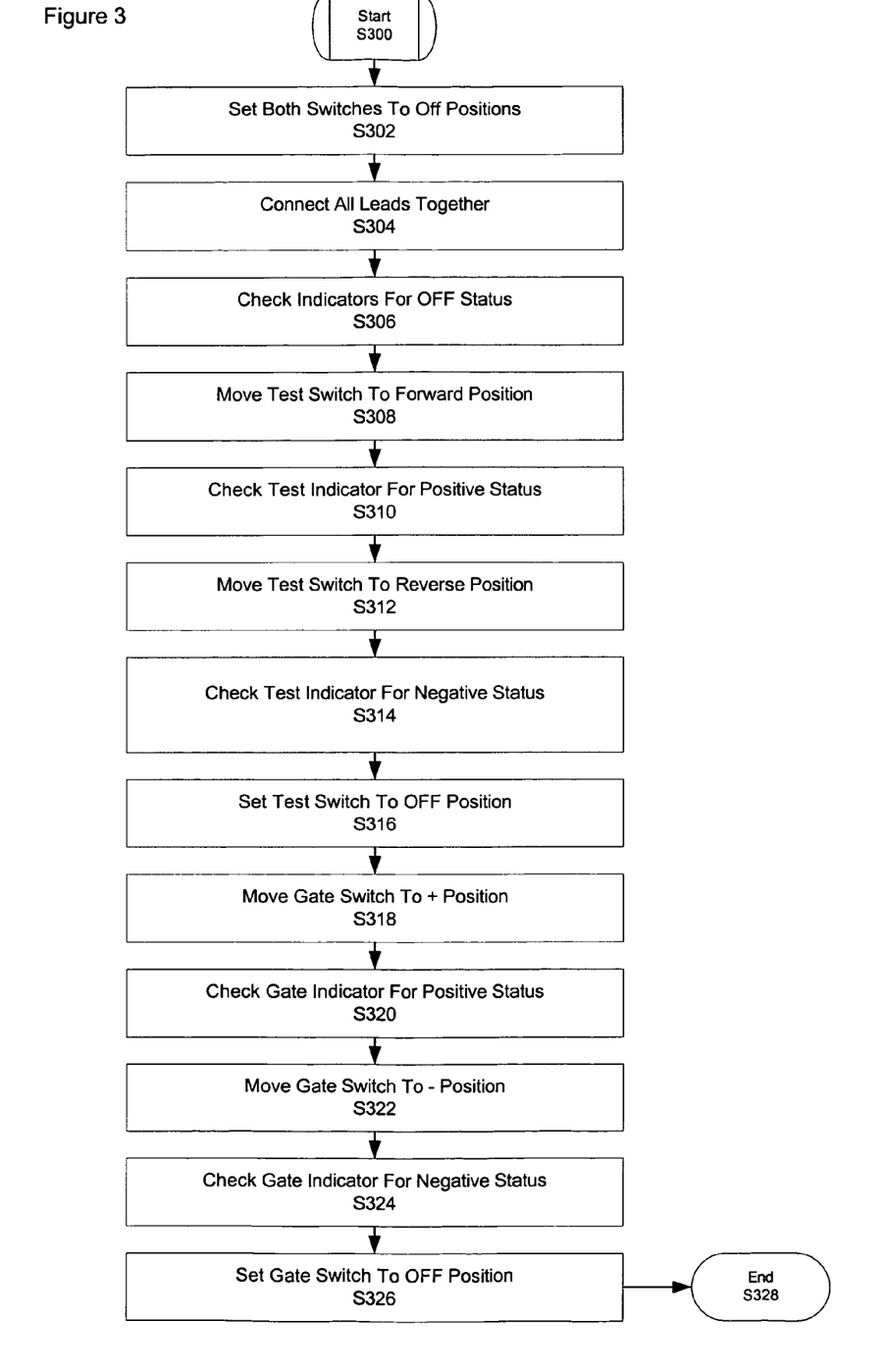
FIG. 3 shows an exemplary method of testing battery operability using a circuit component tester, according to an aspect of the present disclosure.

Before using the tester to test a circuit component, a user of the tester would install fresh batteries, ensure that fuse holders 250, 251 on the tester are intact, and perform a battery check. FIG. 3 shows an exemplary method of testing battery operability using a circuit component tester, according to an aspect of the present disclosure. The process begins at S300. As shown, the user sets both the Test switch 210 and the Gate switch 220 to OFF positions at S302, which may be a default center position between the REV and FWD positions of the Test switch 210 and a default center position between the (−) and (+) positions of the Gate switch 220. The user connects all the leads 230*a*, 230*b*, 230*c* of the circuit component tester together at S304, and ensures that both sets of LEDs 130, 135 and 160, 165 display an OFF status at S306 (e.g., no LEDs are illuminated).

At S308 the user moves the Test switch 210 to a Forward position, and at S310 the user checks the Test LEDs 130, 135 to ensure that a positive status is displayed (e.g., a green LED illuminates). At S312 the user moves the Test switch 210 to a Reverse position, and at S314 the user checks the Test LEDs 130, 135 to ensure that a negative status is displayed (e.g., a red LED illuminates). At S316 the user again sets the Test switch 210 to the OFF position.

At S318 the user moves the Gate switch 220 to a (+) position, and at S320 the user checks the Gate LEDs 160, 165 for positive status (e.g., a green LED illuminates). At S322 the user moves the Gate switch 220 to the (−) position, and at S324 the user checks the Gate LEDs 160, 165 to ensure that a negative status is displayed (e.g., a red LED illuminates). At S326, the Gate switch 220 is set to the OFF position. The process ends at S328.

As described above, a battery test can be initiated. In particular, with all leads 230*a*, 230*b*, 230*c* connected together and both the Test switch 210 and the Gate switch 220 in the OFF positions, there are no conduction paths through the tester. When the Test switch 210 is thrown to either Forward or Reverse position, one path is created to illuminate one of the Test LEDs 130, 135 on the front panel of the tester. When the Test switch 210 is thrown to the Forward position, a path is provided from the positive side of the Test battery 101 to the negative side of the Test battery 101, through the Source/MT1 lead 230*a* and Drain/MT2 lead 230*b* and the voltage divider network of resistors 110, 120 and 140. This arrangement current limits and forward biases the green Test LED 135, permitting the green Test LED 135 to illuminate. When the Test switch 210 is thrown to the Reverse position, a path is provided from the negative side of the Test battery 101 to the positive side of the Test battery 101, through the voltage divider network of resistors 110, 120 and 140 and the Drain/MT2 lead 230*b* and Source/MT1 lead 230*a* leads. This arrangement current limits and forward biases the red Test LED 130 in parallel with the pair of resistors 120 and 140, permitting the red Test LED 130 to illuminate.

With all leads connected together, and the Gate switch 220 in the OFF position, there are no conduction paths through the tester. When the Gate switch 220 is thrown to either (+) or (−) position, one path is created to illuminate one of the Gate LEDs 160, 165 on the front panel of the tester. When the Gate switch 220 is thrown to the (+) position, a path is created from the positive side of the Gate battery 102 to the negative side of the Gate battery 102, through the current limiting resistor 170, the Gate LEDs 160, 165, the Gate lead 230*c* and the Source/MT1 lead 230*a*. This arrangement forward biases and illuminates the green Gate LED 160. When the Gate switch 220 is thrown to the (−) position, a path is created from the negative side of the Gate battery 102 to the positive side of the Gate battery 102 through the Source/MT1 lead 230*a*, the Gate lead 230*c*, the Gate LEDs 160, 165 and the resistor 170. This arrangement forward biases and illuminates the red Gate LED 165.

Figure 4:
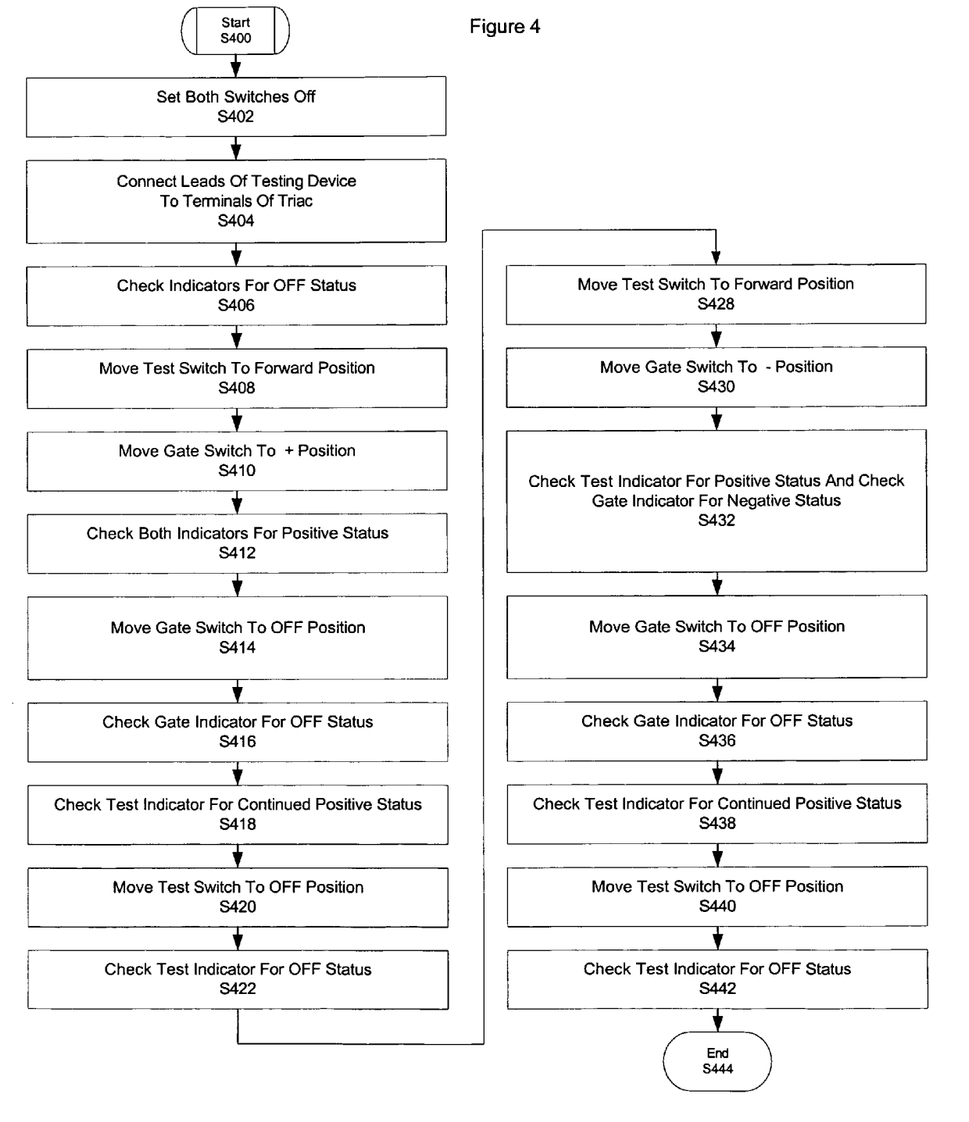
FIG. 4 shows an exemplary method of testing a Triac using a circuit component tester, according to an aspect of the present disclosure.

FIG. 4 shows an exemplary method of testing a Triac using a circuit component tester, according to an aspect of the present disclosure. At S402, the user sets both switches 210, 220 OFF, and at S404 the user connects leads 230*a*, 230*b* and 230*c* of the circuit component tester to the MT1 150, MT2 158 and Gate 154 terminals of the Triac, respectively. The user checks to ensure that the status indicators (LEDs 130, 135, 160 and 165) display an OFF status at S406.

As an example, the terminals 150, 158, 154 of the Triac are connected to three corresponding colored leads 230*a*, 230*b*, 230*c*, respectively. The Gate 154 of the Triac is connected to the green alligator lead 230*c*, the MT1 150 is connected to the red alligator Source/MT1 lead 230*a*, and the MT2 158 is connected to the black alligator Drain/MT2 lead 230*b*. When the Test switch 210 is thrown to the Forward position at S408, the MT1 150 and MT2 158 terminals of the Triac are forward biased by the Test battery 101. This permits the Triac to conduct when gated. When the Gate switch 220 is thrown to the (+) position at S410, a positive bias is placed on the Gate 154 terminal, which illuminates the green Gate LED 160, and permits the Triac to conduct in the forward direction, illuminating the green Test LED 135. The user verifies that both sets of LEDs 130, 135 and 160, 165 display a positive status at S412. When the Gate switch 220 is released at S414, the green Gate LED 165 will extinguish, and a properly functioning Triac will continue to illuminate the green Test LED 135. The user checks the Gate LEDs 160, 165 to ensure that an OFF status is displayed at S416. The user also checks the Test LEDs 130, 135 to ensure that a positive status continues to be displayed at S418. The Test switch 210 is then thrown to the OFF position, interrupting the conduction circuit through the MT1 150 and MT2 158 terminals of the circuit component under test, and the green Test LED 135 is extinguished. The user verifies that the Test LEDs are extinguished at S422.

This process is repeated with the Gate switch 220 moved to a (−) position between S424 and S442. Notably though, at S430, the Gate switch 220 is thrown to the (−) position, and at S432 the user verifies that the green Test LED 135 and the red Gate LED 165 are illuminated. Further, FIG. 5 shows an exemplary method of testing a Triac using a circuit component tester by setting the Test switch 210 to a Reverse position but otherwise performing checks similar to those performed in the method shown in FIG. 4.

As shown in FIG. 4, a user can initiate a forward conduction test for a Triac under test. After checking the batteries and connecting the leads 230*a*, 230*b* and 230*c*, the user places the Test switch 210 in the Forward position. Next, the user momentarily places the Gate switch 220 to the (+) position. As a result, the green Gate LED 160 should illuminate, and the green Test LED 135 should illuminate. Next, the user releases the Gate switch 220. The green Gate LED 160 should extinguish, and the green Test LED 135 should remain illuminated. Next, the user places the Test switch 210 in the center (OFF) position. Now the green Test LED 135 is extinguished. Next, the user places the Test switch 210 in the Forward position and then momentarily places the Gate switch 220 to the (−) position. The red Gate LED 165 should illuminate, and the green Test LED 135 should illuminate. The user then releases the Gate switch 220. The red Gate LED 165 should extinguish, and the green Test LED 135 should remain illuminated. Finally, the user moves the Test switch 210 to the OFF position. The green Test LED 135 is then extinguished.

Figure 5:
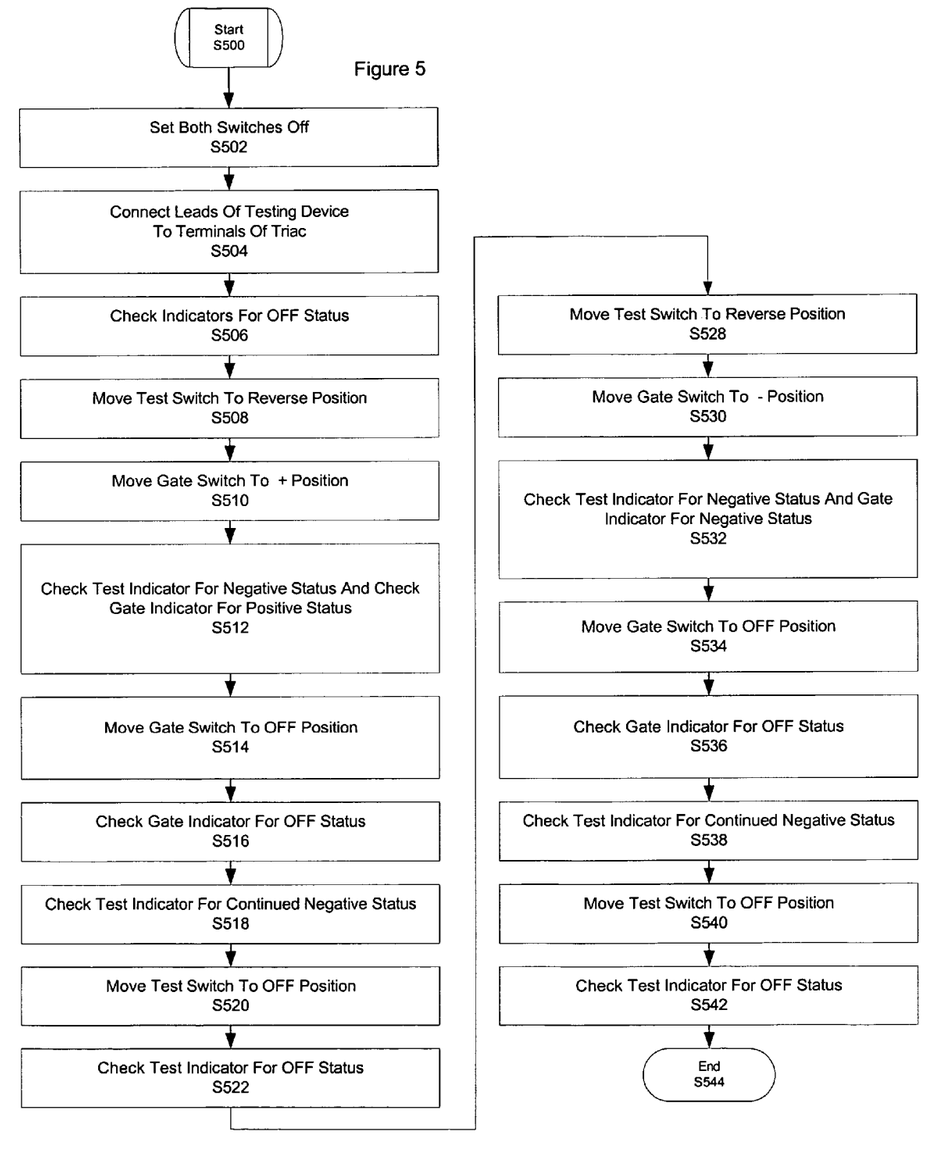
FIG. 5 shows another exemplary method of testing a Triac using a circuit component tester, according to an aspect of the present disclosure.

As shown in FIG. 5, a user can initiate a reverse conduction test for a Triac under test. After checking the batteries and connecting the leads 230a, 230b and 230c at S504, the user places the Test switch 210 in the Reverse position at S508. Next, the user momentarily moves the Gate switch 220 to the (+) position at S510. As a result, the green Gate LED 160 should illuminate, and the red Test LED 130 should illuminate. The user verifies that the red Test LED 130 and the green Gate LED 160 illuminate at S512. Next, the user releases the Gate switch 220 at S514. The green Gate LED 160 should extinguish, and the red Test LED 130 should remain illuminated. The user verifies that the green Gate LED 160 and the red Gate LED 165 are OFF at S516. Next, the user moves the Test switch 210 to the OFF position at S520. Now, the red Test LED 130 should extinguish. The user verifies that the red Test LED 130 and the green Gate LED 160 are OFF at S522.

Next, the process from S502 to S522 is performed again, except that the Gate switch 220 is moved to the (−) position at S530 and the user checks that both the red Test LED 130 and the red Gate LED 165 are illuminated at S532. The user moves the Test switch 210 to the Reverse position at S528 and then momentarily moves the Gate switch 220 to the (−) position at S530. The red Gate LED 165 should illuminate, and the red Test LED 130 should illuminate. The user next releases the Gate switch 220 at S534. The red Gate LED 165 should extinguish, and the red Test LED 130 should remain illuminated. The user checks to verify that the red Gate LED 165 and the green Gate LED 160 are off at S536. The user checks to verify that the red Test LED 130 remains illuminated at S538. Finally, the user places the Test switch 210 to the center (OFF) position at S540. The red Test LED 130 is then extinguished. The user checks to verify that the red Test LED 130 and the green Test LED 135 are not illuminated at S542.

In the forward conduction test and reverse conduction test as described above with respect to FIGS. 4 and 5, if the Test LEDs 130, 135 never illuminate, the Source/MT1 lead 230a and Drain/MT2 lead 230b should be disconnected and shorted together. Next, the Test switch 210 should be moved to both the Forward and Reverse positions. If the illuminated LED changes from the green Test LED 135 to the red Test LED 130, the user should reverse the Source/MT1 lead 230a and Drain/MT2 lead 230b on the Triac under test and repeat the forward and reverse conduction tests. If the Test LEDs 130, 135 still do not illuminate, the Triac has failed.

As described above, exemplary methods for testing the four quadrants of operation of a Triac are shown in FIGS. 4 and 5. The switch positions and expected LED colors correspond to the following chart:

The following is a sequence Table for an intact Triac:

| Test Switch Position | Gate Switch Position | Test LED | Gate LED |
|---|---|---|---|
| OFF | OFF | OFF | OFF |
| OFF | + | OFF | Green |
| OFF | − | OFF | Red |
| Forward | OFF | OFF | OFF |
| Forward | + | Green | Green |
| Forward | − | Green | Red |
| Reverse | OFF | OFF | OFF |
| Reverse | + | Red | Green |
| Reverse | − | Red | Red |

Figure 6:
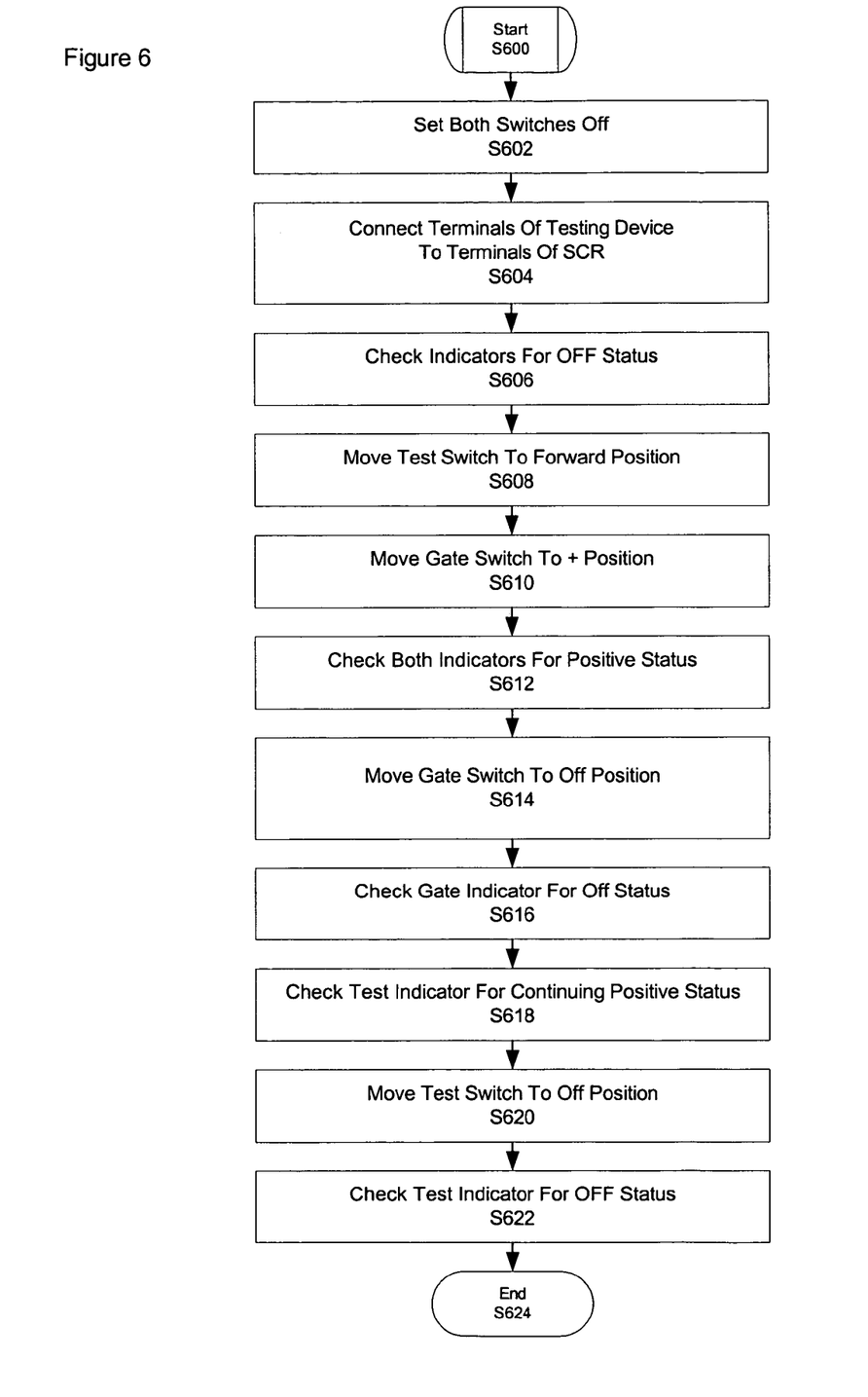
FIG. 6 shows an exemplary method of testing a SCR using a circuit component tester, according to an aspect of the present disclosure.

FIG. 6 shows an exemplary method of testing a SCR using a circuit component tester, according to an aspect of the present disclosure.

Both the Test switch 210 and the Gate switch 220 are set to OFF at S602. An SCR is connected to the three colored leads from the tester at S604. The Gate 154 of the SCR is connected to the green alligator Gate lead 230c, the Source 150 is connected to the red alligator Source/MT1 lead 230a and the Drain 158 is connected to the black alligator Drain/MT2 lead 230b. At S606, the user checks the LEDs 130, 135, 160 and 165 to verify that they are OFF. When the Test switch 210 is thrown to the Forward position at S608, the Source terminal 150 and Drain terminal 158 of the SCR under test are forward biased by the Test battery 101 through the voltage divider network. This permits the SCR to conduct when gated. When the Gate switch 220 is thrown to the (+) position at S610, a positive bias is placed on the Gate 154 terminal of the SCR under test, which illuminates the green Gate LED 160, and permits the SCR to conduct in the forward direction, illuminating the green Test LED 135. The user checks the green Gate LED 160 and the green Test LED 135 at S612 to verify that each is illuminated. When the Gate switch 220 is released at S614, the green Gate LED 160 will extinguish, and a properly functioning SCR will continue to illuminate the green Test LED 135. The user checks the green Gate LED 160 at S616 to verify that it is OFF. The user checks the green Test LED 135 at S618 to verify that it remains illuminated. The Test switch 210 is then thrown to the OFF position at S620, interrupting the conduction circuit through the Source 150 and Drain 158 terminals of the SCR under test, and the green Test LED 135 extinguishes. The user checks the green Test LED 135 at S622 to verify that it is OFF. The SCR has only one mode of operation and, accordingly, all other combination of switches will not illuminate the Test LEDs 130, 135.

As described above, the circuit component tester described herein can be used to test the condition of the internal batteries, to test a questionable Triac by properly biasing the device and testing for proper operation in 4 quadrants of operation, and to test a questionable SCR by properly biasing the device and testing for proper operation. The circuit component tester supplies a conducting battery bias between the Source/MT1 terminal 150 and Drain/MT2 terminal 158 of the SCR/Triac under test, and a conducting battery bias between the Gate terminal 154 and Drain/MT2 terminal 158 of the SCR/Triac under test. The circuit component tester can be used to reverse the polarity of the Source/MT1 terminal 150 and Drain/MT2 terminal 158 to test for conduction, and to reverse the polarity of the Gate 154 and Drain/MT2 terminal 158 to test for conduction. The circuit component tester can be used to test for short circuits between the Source/MT1 terminal 150 and Drain/MT2 terminal 158, and to test for short circuits between the Gate terminal 154 and Drain/MT2 terminal 158.

Results of the tests as described above are interpreted to determine whether the SCR or Triac functions properly. For example, illumination of the Test LEDs 130, 135 with Test switch 210 in either Forward or Reverse position prior to operating the Gate switch 220 indicates a shorted Triac/SCR. No illumination of the Test LEDs 130, 135 when operating Gate switch 220 indicates an open Triac/SCR. No illumination of the Gate LEDs 160, 165 when operating the Gate switch 220 indicates an open Triac/SCR. If the wrong color Test LEDs 130, 135 illuminate when operating the Gate switch 220 it is likely that Source/MT1 lead 230a and Drain/MT2 lead 230b are reversed. Further, in testing the batteries as described herein with respect to FIG. 3, if one or more LED fails to illuminate when expected, the user can determine that the tester or the circuit component under test is faulty.

Further, as described above, a portable circuit component tester can be used to conduct a variety of operational tests to verify proper functionality of a Triac or SCR. The portable circuit component tester can be provided in a compact casing with few components such that Triacs and SCRs can be efficiently and accurately tested, eliminating the need to discard "questionable" Triacs and SCRs if no such circuit component tester were available.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather, the disclosure extends to all functionally equivalent structures, methods, and uses such as are within the scope of the appended claims.

What is claimed is:

1. A circuit component tester, comprising:
   a portable casing;
   a circuit provided within the casing;
   a plurality of leads for electrically connecting the circuit to a gate and two terminals of a circuit component under test;
   at least one switch provided on the casing to initiate application of test voltage to at least one of the two terminals of the circuit component under test and to initiate application of gate voltage to the gate of the circuit component under test,
   wherein the at least one switch is operable to verify functionality of the circuit component under test.

2. The circuit component tester of claim 1, the plurality of leads further comprising:
   a first test lead arranged in a path between a positive side of a test battery and a second test lead.

3. The circuit component tester of claim 2, the circuit further comprising:
   a voltage divider network arranged between the second test lead and a negative side of the test battery; and
   a first light emitting diode and a second light emitting diode aligned oppositely and arranged in parallel to the first light emitting diode.

4. The circuit component tester of claim 3, the voltage divider network further comprising:
   a first resistor and a second resistor arranged in parallel with the first resistor; and
   a third resistor arranged between the negative side of the test battery and the parallel first resistor and second resistor.

5. The circuit component tester of claim 4,
   wherein values of the first resistor and the second resistor are substantially equal.

6. The circuit component tester of claim 4, the at least one switch further comprising:
   a test switch to initiate the application of test voltage to at least one of the two terminals of the circuit component under test; and
   a gate switch to initiate the application of gate voltage to the gate of the circuit component under test.

7. The circuit component tester of claim 6,
   wherein the first light emitting diode and the second light emitting diode are arranged in parallel to the first resistor and the second resistor.

8. The circuit component tester of claim 7, the circuit further comprising:
   a fourth resistor arranged between a positive terminal of a gate battery and a gate lead.

9. The circuit component tester of claim 8, the circuit further comprising:
   a third light emitting diode and a fourth light emitting diode aligned oppositely and arranged in parallel to the third light emitting diode.

10. The circuit component tester of claim 8, wherein voltage values of the batteries and resistance values of the first resistor, second resistor, third resistor and fourth resistor are selected to generate a test current within a specification of the circuit component under test.

11. The circuit component tester of claim 9,
   wherein the parallel third light emitting diode and fourth light emitting diode are arranged between the fourth resistor and the gate lead.

12. The circuit component tester of claim 9,
   wherein one of the first and second light emitting diodes is activated when the test switch is moved to a forward position.

13. The circuit component tester of claim 12,
   wherein the other of the first and second light emitting diodes is activated when the test switch is moved to a reverse position.

14. The circuit component tester of claim 13,
   wherein one of the third and fourth light emitting diodes is activated when the gate switch is moved to a positive position.

15. The circuit component tester of claim 14,
   wherein the other of the third and fourth light emitting diodes is activated when the gate switch is moved to a negative position.

16. The circuit component tester of claim 15,
   wherein the circuit component under test is determined to function properly when the one of the first and second light emitting diodes remains activated after the gate switch is moved to an off position and the one of the third and fourth light emitting diodes is resultantly inactivated.

17. A method of testing circuit components, comprising:
   connecting a plurality of leads for electrically connecting a circuit of a circuit component tester to a gate and two terminals of a circuit component under test;
   activating a test switch provided on a portable casing to initiate application of a test voltage to at least one of two terminals of a circuit component under test; and
   activating a gate switch provided on the portable casing to initiate application of a gate voltage to a gate of the circuit component under test,
   wherein at least one of the test switch and the gate switch are operable to verify functionality of the circuit component under test.

18. The method of testing circuit components of claim 17, further comprising:
   verifying that one of a plurality of light emitting diodes on the circuit component tester illuminates in response to at least one of activating the test switch and activating the gate switch.

19. The method of testing circuit components of claim 18, further comprising:
   reversing at least one of the test switch and the gate switch, and verifying that at least one of the plurality of light emitting diodes changes illumination status in response.

20. A circuit of a circuit component tester, the circuit comprising:
   a plurality of leads for electrically connecting the circuit to a gate and two terminals of a circuit component under test;
   a test switch that is moved to initiate application of test voltage to at least one of the two terminals of the circuit component under test;
   a gate switch that is moved to initiate application of gate voltage to the gate of the circuit component under test; and
   a plurality of light emitting diodes that illuminate in response to the movement of at least one of the test switch and the gate switch when the circuit component under test operates properly,
   wherein at least one of the test switch and the gate switch are operable to verify functionality of the circuit component under test.

21. The circuit of a circuit component tester of claim 20,
   wherein the circuit component under test is one of a silicon controlled rectifier and a triac.

* * * * *